United States Patent
Kawajiri et al.

(10) Patent No.: US 10,459,047 B2
(45) Date of Patent: Oct. 29, 2019

(54) MAGNETIC RESONANCE IMAGING APPARATUS AND GRADIENT MAGNETIC FIELD POWER SUPPLY

(71) Applicant: TOSHIBA MEDICAL SYSTEMS CORPORATION, Otawara-shi (JP)

(72) Inventors: Sho Kawajiri, Nasushiobara (JP); Motohiro Miura, Yaita (JP)

(73) Assignee: Canon Medical Systems Corporation, Otawara-shi (JP)

( * ) Notice: Subject to any disclaimer, the term of this patent is extended or adjusted under 35 U.S.C. 154(b) by 662 days.

(21) Appl. No.: 14/699,125

(22) Filed: Apr. 29, 2015

(65) Prior Publication Data

US 2015/0316629 A1 Nov. 5, 2015

(30) Foreign Application Priority Data

May 2, 2014 (JP) .................................. 2014-095393

(51) Int. Cl.
| | | |
|---|---|---|
| *G01V 3/00* | (2006.01) | |
| *G01R 33/385* | (2006.01) | |
| *G01R 33/54* | (2006.01) | |
| *G01R 33/34* | (2006.01) | |

(52) U.S. Cl.
CPC ... *G01R 33/3852* (2013.01); *G01R 33/34092* (2013.01); *G01R 33/543* (2013.01)

(58) Field of Classification Search
CPC .................................................. G01R 33/3852
USPC .................................................. 324/322, 318
See application file for complete search history.

(56) References Cited

U.S. PATENT DOCUMENTS

| | | | | |
|---|---|---|---|---|
| 5,663,647 A | * | 9/1997 | Wirth ................. | G01R 33/3852 324/322 |
| 7,714,583 B2 | * | 5/2010 | Zhu ...................... | H02M 7/217 324/318 |
| 8,278,927 B2 | * | 10/2012 | Venkatesa ............ | H02M 7/487 324/309 |
| 8,749,094 B2 | | 6/2014 | Huisman | |

(Continued)

FOREIGN PATENT DOCUMENTS

| | | |
|---|---|---|
| JP | 2009-050466 | 3/2009 |
| JP | 2012-522477 A | 9/2012 |
| JP | 2014-83303 A | 5/2014 |

OTHER PUBLICATIONS

Japanese Office Action dated Dec. 19, 2017 in Japanese Patent Application No. 2014-095393, 2 pages.

(Continued)

*Primary Examiner* — Louis M Arana

(74) *Attorney, Agent, or Firm* — Oblon, McClelland, Maier & Neustadt, L.L.P.

(57) ABSTRACT

A magnetic resonance imaging apparatus according to an embodiment includes a gradient magnetic field power supply configured to supply power to a gradient coil. The gradient magnetic field power supply includes a plurality of switching circuits and a processing circuitry. Each of the switching circuits is configured to output a predetermined pulse voltage. The processing circuitry is configured to change the number of switching circuits to be caused to perform switching operation among the switching circuits, in accordance with an intensity of the voltage to be output to the gradient coil.

12 Claims, 12 Drawing Sheets

(56) References Cited

U.S. PATENT DOCUMENTS 8,760,164 B2 *  6/2014  Rivas Davila ....... G01R 33/385
                                                  324/307
9,222,997 B2 * 12/2015  Ham .................. G01R 33/3852

OTHER PUBLICATIONS

Office Action dated Jul. 24, 2018, in Japanese Patent Application No. 2014-095393.

* cited by examiner

MAGNETIC RESONANCE IMAGING APPARATUS AND GRADIENT MAGNETIC FIELD POWER SUPPLY

CROSS-REFERENCE TO RELATED APPLICATIONS

This application is based upon and claims the benefit of priority from Japanese Patent Application No. 2014-095393, filed on May 2, 2014, the entire contents of all of which are incorporated herein by reference.

FIELD

Embodiments described herein relate generally to a magnetic resonance imaging apparatus and a gradient magnetic field power supply.

BACKGROUND

Conventionally, magnetic resonance imaging apparatuses include a gradient magnetic field power supply that supplies electric power to a gradient coil that generates a gradient magnetic field in an imaging space. For example, the gradient magnetic field power supply includes a plurality of switching circuits that are cascade-connected, and each of the switching circuits outputs a predetermined pulse voltage. Each of the switching circuit has a predetermined number of switching elements, and the switching elements mutually perform switching operation, to output a pulse voltage in accordance with the waveform of a current flowing through the gradient coil. It is known that a switching loss occurs when each of the switching elements performs switching operation as described above.

DETAILED DESCRIPTION

A magnetic resonance imaging apparatus according to an embodiment includes a gradient magnetic field power supply configured to supply power to a gradient coil. The gradient magnetic field power supply includes a plurality of switching circuits and a processing circuitry. Each of the switching circuits is configured to output a predetermined pulse voltage. The processing circuitry is configured to change the number of switching circuits to be caused to perform switching operation among the switching circuits, in accordance with an intensity of the voltage to be output to the gradient coil.

Embodiments of the MRI apparatus and the gradient magnetic field power supply will be explained hereinafter with reference to the accompanying drawings.

First Embodiment

Figure 1:
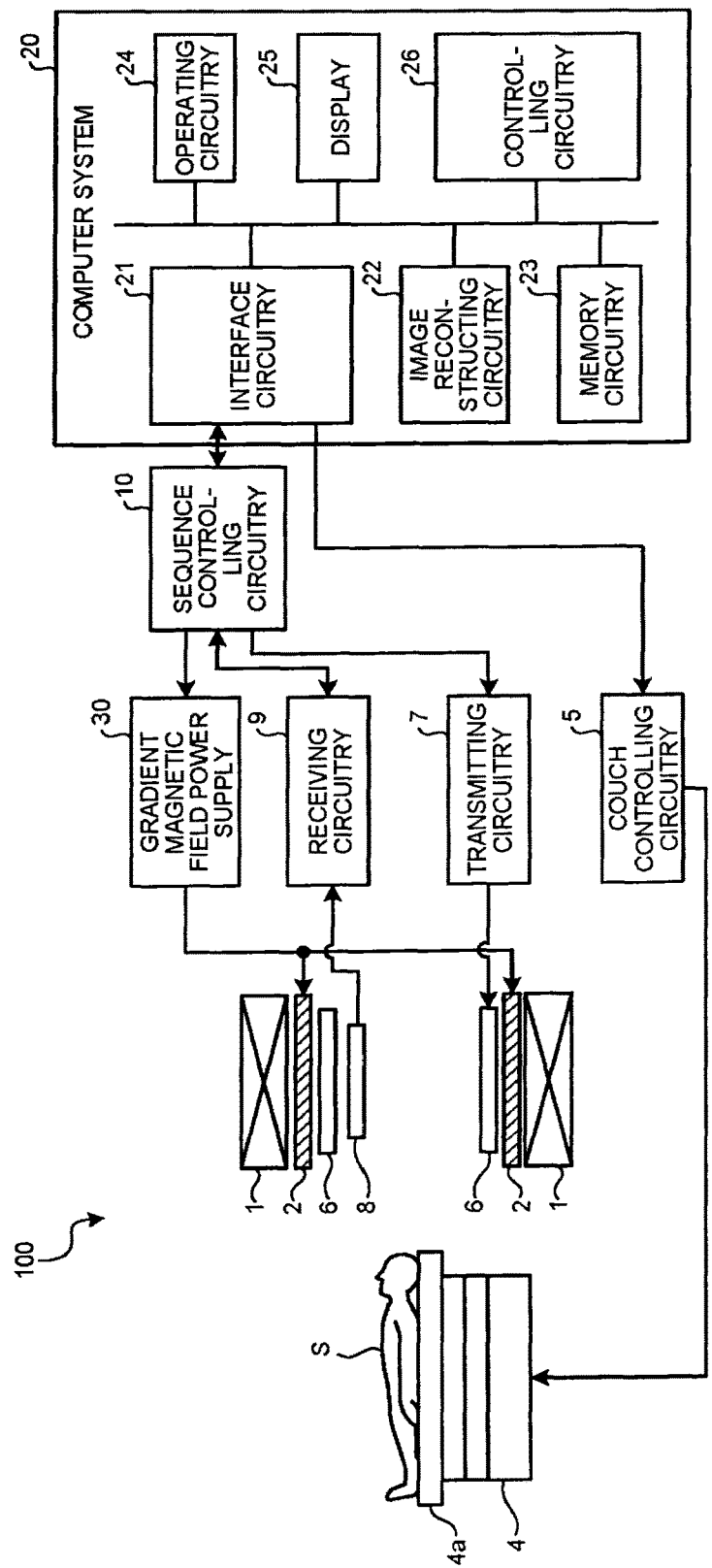
FIG. 1 is a diagram illustrating a configuration example of a magnetic resonance imaging (MRI) apparatus according to an embodiment.

FIG. 1 is a diagram illustrating a configuration example of an MRI apparatus according to a first embodiment. For example, as illustrated in FIG. 1, an MRI apparatus 100 includes a static magnetic field magnet 1, a gradient coil 2, a gradient magnetic field power supply 30, a couch 4, a couch controlling circuitry 5, a transmission coil 6, a transmitting circuitry 7, reception coils 8, a receiving circuitry 9, a sequence controlling circuitry 10, and a computer system 20.

The static magnetic field magnet 1 is formed to have a generally cylindrical hollow shape (including a shape having an oval cross section perpendicular to the central axis of the cylinder), to generate a uniform static magnetic field in an imaging space formed inside thereof. The static magnetic field magnet 1 is, for example, a permanent magnet, or a superconducting magnet.

The gradient coil 2 is formed to have a generally cylindrical hollow shape (including a shape having an oval cross section perpendicular to the central axis of the cylinder), and disposed inside the static magnetic field magnet 1. Specifically, the gradient coil 2 is formed of a combination of three coils corresponding to respective axes x, y, and z that are perpendicular to each other. The three coils generate, in the imaging space, gradient magnetic fields having respective magnetic field intensities changing along the respective axes of x, y, and z, with a current that is individually supplied from the gradient magnetic field power supply 30 described later. The z axis direction is the same direction as that of the static magnetic field.

The gradient magnetic fields of the respective axes x, y, and z generated by the gradient coil 2 correspond to, for example, a slice selection gradient magnetic field Gss, a phase encode gradient magnetic field Gpe, and a read out gradient magnetic field Gro, respectively. The slice selection gradient magnetic field Gss is used for determining a cross section as desired. The phase encode gradient magnetic field Gpe is used for changing the phase of a magnetic resonance signal in accordance with the spatial position. The read out gradient magnetic field Gro is used for changing the frequency of the magnetic resonance signal in accordance with the spatial position.

The gradient magnetic field power supply 30 supplies electric power to the gradient coil 2 under the control of the sequence controlling circuitry 10 described later.

The couch 4 includes a couchtop 4a on which a subject S is placed. The couch 4 inserts the couchtop 4a into a cavity (imaging port) of the gradient coil 2 under the control of the couch controlling circuitry 5 described later. Generally, the couch 4 is set such that the longitudinal direction thereof is parallel with the central axis of the static magnetic field magnet 1.

The couch controlling circuitry 5 controls the operation of the couch 4 under the control of the computer system 20 described later. For example, the couch controlling circuitry 5 drives the couch 4 to move the couchtop 4a in the longitudinal direction, the vertical direction, or the lateral direction.

The transmission coil 6 is formed to have a generally cylindrical hollow shape (including a shape having an oval cross section perpendicular to the central axis of the cylinder), and disposed inside the gradient coil 2. The transmission coil 6 applies a high-frequency magnetic field to the imaging space with a high-frequency pulse current that is supplied from the transmitting circuitry 7 described later.

The transmitting circuitry 7 supplies a high-frequency pulse current corresponding to a Larmor frequency to the transmission coil 6, under the control of the sequence controlling circuitry 10 described later.

The reception coils 8 are prepared for respective regions of the object to be imaged, and attached to respective regions of the subject S. When a high-frequency magnetic field is applied to the imaging space by the transmission coil 6, each reception coil 8 receives a magnetic resonance signal that is emitted from the subject S placed in the imaging space, and outputs the received magnetic resonance signal to the receiving circuitry 9. For example, the reception coils 8 are a head reception coil, a spinal column reception coil, and an abdominal reception coil.

The receiving circuitry 9 generates magnetic resonance (MR) signal data based on the magnetic resonance signals received by the reception coils 8, under the control of the sequence controlling circuitry 10 described later. Specifically, the receiving circuitry 9 converts the magnetic resonance signals into digital signals to generate MR signal data, and transmits the generated MR signal data to the sequence controlling circuitry 10. In the MR signal data, information of spatial frequencies of the phase encode (PE) direction, the read out (RO) direction, and the slice selection (SS) direction are associated with each other by the slice selection gradient magnetic field Gss, the phase encode gradient magnetic field Gpe, and the read out gradient magnetic field Gro described above, and disposed in the k space.

Although the present embodiment illustrates an example of the case where the transmission coil 6 applies a high-frequency magnetic field and the reception coils 8 receive magnetic resonance signals, the present embodiments are not limited to the case. For example, the transmission coil 6 may further include a reception function of receiving the magnetic resonance signal, or the reception coils 8 may further include a transmission function of applying a high-frequency magnetic field. When the transmission coil 6 has the reception function, the receiving circuitry 9 generates MR signal data also from the magnetic resonance signal received by the transmission coil 6. When the reception coils 8 have the transmission function, the transmitting circuitry 7 also supplies the high-frequency pulse current to the reception coils 8.

The sequence controlling circuitry 10 executes various sequences to control imaging. Specifically, the sequence controlling circuitry 10 drives the gradient magnetic field power supply 30, the transmitting circuitry 7, and the receiving circuitry 9 based on sequence execution data transmitted from the computer system 20, to collect MR signal data. The sequence controlling circuitry 10 also transmits the collected MR signal data to the computer system 20.

For example, the sequence controlling circuitry 10 includes a processor such as a central processing unit (CPU) and a micro processing unit (MPU), and a memory. In such a case, the memory stores a plurality of instructions that define the procedure of various processing executed by the sequence controlling circuitry 10 and can be executed by the processor. The processor executes various processing by executing the instructions stored in the memory.

The sequence execution data is information that defines the sequence (also referred to as pulse sequence) that indicates the procedure for collecting MR signal data related to the subject S. Specifically, the sequence execution data is information that defines the intensity of the power supply supplied from the gradient magnetic field power supply 30 to the gradient coil 2 and the timing of supply of the power supply, the intensity of the RF signal transmitted from the transmitting circuitry 7 to the transmission coil 6 and the timing of transmission of the RF signal, and the timing at which the receiving circuitry 9 detects a magnetic resonance signal.

The computer system 20 controls the whole MRI apparatus 100. For example, the computer system 20 drives the components included in the MRI apparatus 100, to collect data of the subject S and reconstruct the image. The computer system 20 includes an interface circuitry 21, an image reconstructing circuitry 22, a memory circuitry 23, an operating circuitry 24, a display 25, and a controlling circuitry 26.

The interface circuitry 21 controls input and output of various signals that are transmitted to and received from the sequence controlling circuitry 10. For example, the interface circuitry 21 transmits sequence execution data to the sequence controlling circuitry 10, and receives MR signal data from the sequence controlling circuitry 10. When the interface circuitry 21 receives MR signal data, the interface circuitry 21 stores each MR signal data piece for each subject S in the memory circuitry 23.

The image reconstructing circuitry 22 subjects the MR signal data stored in the memory circuitry 23 to post-processing, that is, reconstruction such as Fourier transform, to generate spectrum data or image data of a desired nuclear spin in the body of the subject S. The image reconstructing circuitry 22 also stores the generated spectrum data or image data for each subject S in the memory circuitry 23.

The memory circuitry 23 stores various data and various programs that are necessary for processing executed by the controlling circuitry 26. For example, the memory circuitry 23 stores MR signal data received by the interface circuitry 21, and spectrum data or image data generated by the image reconstructing circuitry 22 for each subject S. The memory circuitry 23 is, for example, a semiconductor memory device such as a random access memory (RAM), a read only memory (ROM), and a flash memory, or a storage device such as a hard disk and an optical disk.

The operating circuitry 24 receives various instructions from the operator and information inputs. The operating circuitry 24 is, for example, a pointing device such as a mouse and a trackball, a selection device such as a mode selector switch, or an input device such as a keyboard.

The display 25 displays various types of information such as spectrum data and image data. The display 25 is, for example, a display device such as a liquid crystal display device.

The controlling circuitry 26 controls the whole MRI apparatus 100. For example, the controlling circuitry 26 generates sequence execution data, based on imaging conditions that are input through the operating circuitry 24. The controlling circuitry 26 also transmits the sequence execution data to the sequence controlling circuitry 10, to control the sequence controlling circuitry 10 to execute various sequences. The controlling circuitry 26 also controls the image reconstructing circuitry 22 to reconstruct an image based on the MR signal data transmitted from the sequence controlling circuitry 10.

For example, the controlling circuitry 26 includes a processor such as a CPU and an MPU, and a memory. In such a case, the memory stores a plurality of instructions that define the procedure of various processing executed by the sequence controlling circuitry 10 and can be executed by the processor. The processor executes various processing by executing the instructions stored in the memory.

The configuration of the MRI apparatus 100 according to the present embodiment has been explained above. In the MRI apparatus 100 having the configuration explained above, the gradient magnetic field power supply 30 includes a plurality of switching circuits and an observing circuitry. Each of the switching circuits outputs a predetermined pulse voltage. The observing circuitry changes the number of the switching circuits that are caused to perform switching operation among the switching circuits, in accordance with the intensity of the voltage to be output to the gradient coil 2.

For example, the gradient magnetic field power supply 30 includes a plurality of switching circuits that are cascade-connected, and each of the switching circuits outputs a predetermined pulse voltage. Each of the switching circuits has a predetermined number of switching elements, and the switching elements mutually perform switching operation, to output a pulse voltage in accordance with the waveform of a current flowing through the gradient coil 2.

The following is detailed explanation of the gradient magnetic field power supply 30 described above. Although the present embodiment illustrates an example of the case where a full bridge circuit is used as each of the switching circuits included in the gradient magnetic field power supply 30, similar embodiments can be carried out also in the case of using switching circuits of other types.

Figure 2:
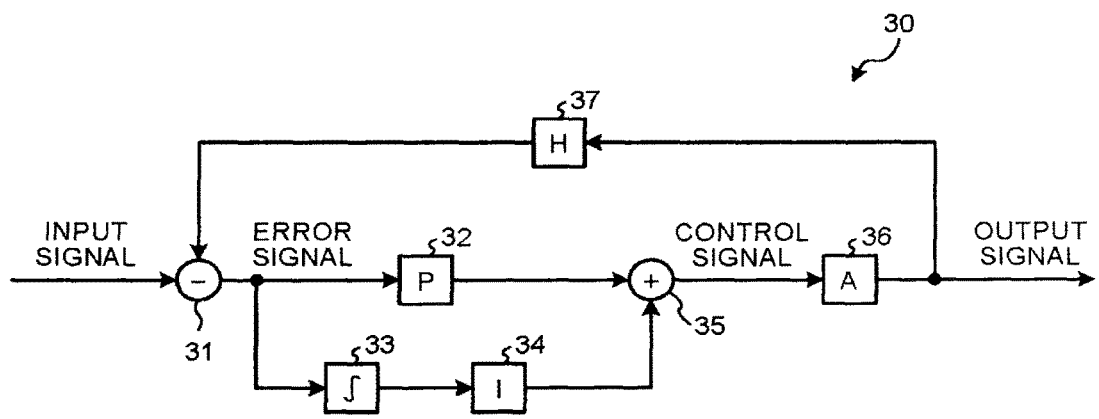
FIG. 2 is a diagram illustrating a configuration example of a gradient magnetic field power supply according to a first embodiment.

FIG. 2 is a diagram illustrating a configuration example of the gradient magnetic field power supply 30 according to the first embodiment. The gradient magnetic field power supply 30 according to the present embodiment receives an input signal transmitted from the sequence controlling circuitry 10, and outputs a voltage corresponding to the received input signal to the gradient coil 2. The input signal is a signal that indicates a waveform of the gradient magnetic field generated by the gradient coil 2, and simulates the waveform of the gradient magnetic field with a current. For example, as illustrated in FIG. 2, the gradient magnetic field power supply 30 includes a subtracting circuitry 31, a proportionating circuitry 32, an integral term circuitry 33, an integrating circuitry 34, an adding circuitry 35, an amplifier circuitry 36, and a compensating circuitry 37.

The subtracting circuitry 31 calculates difference between the input signal transmitted from the sequence controlling circuitry 10 and the feedback signal transmitted from the compensating circuitry 37, and outputs the resultant signal as an error signal. The proportionating circuitry 32 converts the error signal that is output from the subtracting circuitry 31 with a predetermined proportional gain, and outputs the converted signal. The integral term circuitry 33 and the integrating circuitry 34 convert the error signal that is output from the subtracting circuitry 31 with a predetermined integral gain, and output the converted signal.

The adding circuitry 35 adds the signal that is output from the proportionating circuitry 32 to the signal that is output from the integrating circuitry 34, and outputs the resultant signal as a control signal. The amplifier circuitry 36 generates a voltage corresponding to the control signal that is output from the adding circuitry 35, and outputs the generated voltage as an output signal. The compensating circuitry 37 feeds back the output signal that is output from the amplifier circuitry 36 to the subtracting circuitry 31.

In the gradient magnetic field power supply 30, the components operate as described above to control the voltage that is to be output to the gradient coil 2 such that a current having a waveform matching with the waveform of the input signal transmitted from the sequence controlling circuitry 10 flows through the gradient coil 2. In such control, the amplifier circuitry 36 in the gradient magnetic field power supply 30 generates a pulse voltage obtained by modulating the pulse width thereof in accordance With the control signal that is output from the adding circuitry 35, and outputs the generated pulse voltage as an output signal.

Figure 3:
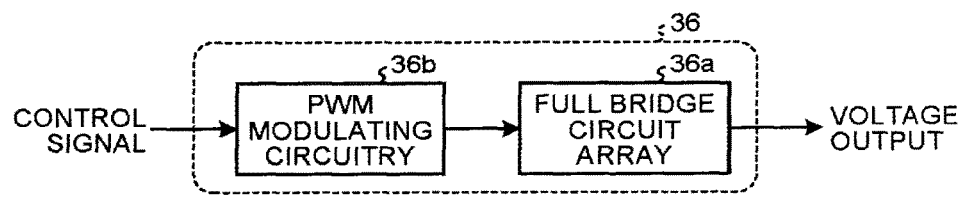
FIG. 3 is a diagram illustrating a configuration example of an amplifier according to the first embodiment.

FIG. 3 is a diagram illustrating a configuration example of the amplifier circuitry 36 according to the first embodiment. For example, as illustrated in FIG. 3, the amplifier circuitry 36 includes a full bridge circuit array 36a and a PWM modulating circuitry 36b.

The full bridge circuit array 36a outputs a voltage corresponding to the input signal transmitted from the sequence controlling circuitry 10 to the gradient coil 2. Specifically, the full bridge circuit array 36a includes a plurality of full bridge circuits that are cascade-connected, and each full bridge circuit outputs a predetermined pulse voltage. Each of the full bridge circuits has a predetermined number of switching elements, and the switching elements mutually perform switching operation, to output a pulse voltage corresponding to the waveform of a current to be run through the gradient coil 2.

The PWM modulating circuitry 36b controls the operation of the full bridge circuit array 36a in accordance with the control signal that is output from the adding circuitry 35. Specifically, the PWM modulating circuitry 36b performs pulse width modulation (PWM) in accordance with the intensity of the control signal that is output from the adding circuitry 35, to control the duty ratio of the pulse voltage that is output from each of the full bridge circuits included in the full bridge circuit array 36a. The PWM modulating circuitry 36b outputs a driving signal for turning on/off each of the switching elements of each full bridge circuit in the full bridge circuits included in the full bridge circuit array 36a, to control the duty ratio of the pulse voltage that is output from each full bridge circuit.

Figure 4:
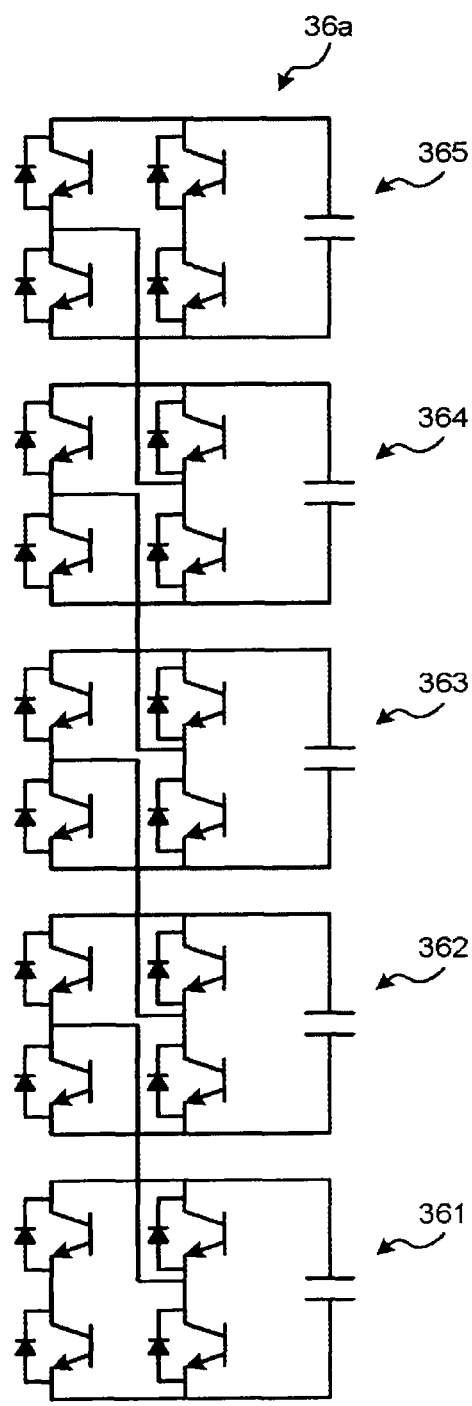
FIG. 4 is a diagram illustrating the structure of a full bridge circuit array according to the first embodiment.

FIG. 4 is a diagram illustrating the structure of the full bridge circuit array 36a according to the first embodiment. For example, as illustrated in FIG. 4, the full bridge circuit array 36a includes full bridge circuits 361 to 365 that are cascade-connected to have five stages. In this structure, for example, each of the full bridge circuits includes four switching elements. The four switching elements form two pairs of switching elements that are connected in series, and the two pairs each are connected in parallel.

Normally, in the full bridge circuit array 36a, each of the switching elements included in all the full-bridge circuits of the five stages performs switching operation, based on the driving signal that is output from the PWM modulating circuitry 36b, such that the duty ratios of the pulse voltages that are output from all the full bridge circuits of the five stages have the same value.

Figure 5:
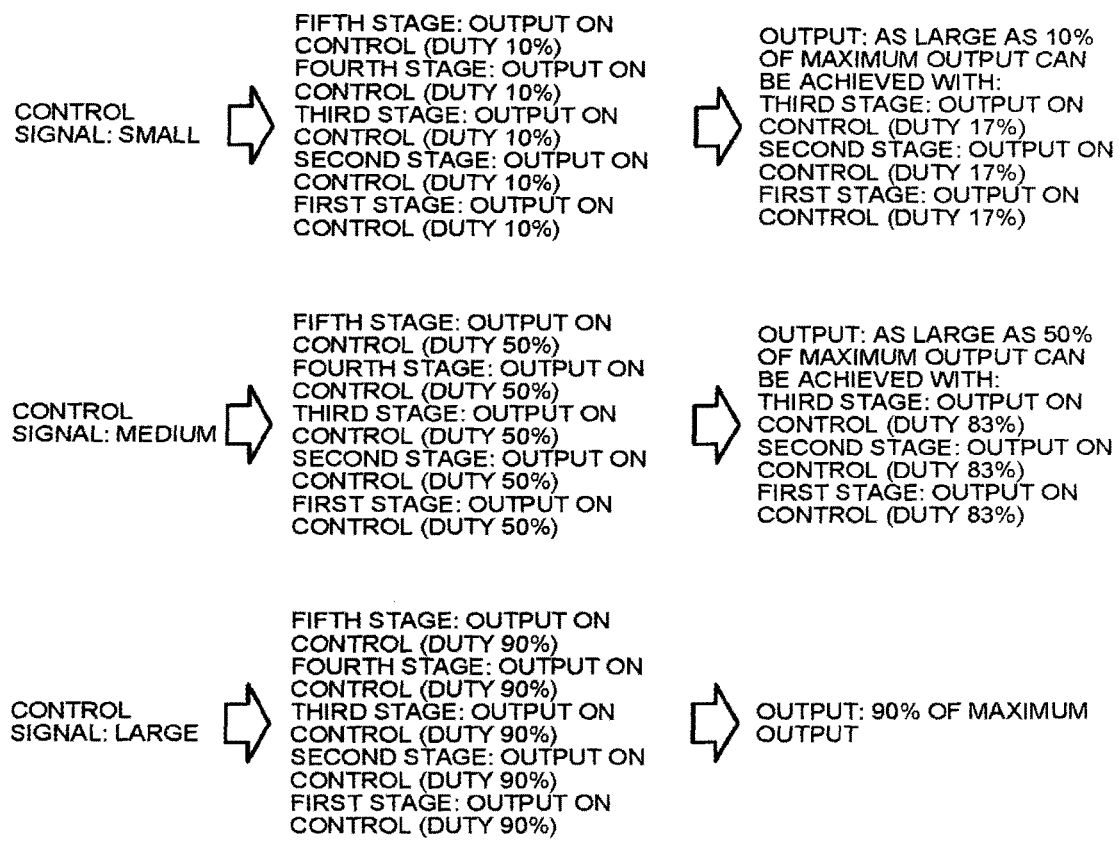
FIG. 5 is a diagram illustrating an example of relation between the control signal and the output voltage in the full bridge circuit array according to the first embodiment.

FIG. 5 is a diagram illustrating an example of relation between the control signal and the output voltage in the full bridge circuit array 36a according to the first embodiment.

For example, as illustrated in the upper part of FIG. 5, when the intensity of the control signal is small, the switching elements of each full bridge circuit perform switching operation in the full bridge circuit array 36a such that the pulse voltage that is output from each of all the full bridge circuits of the five stages has a duty ratio of 10%. In this manner, the output voltage obtained is as large as 10% of the maximum voltage.

In addition, for example, as illustrated in the middle part of FIG. 5, when the intensity of the control signal is medium, the switching elements of each full bridge circuit perform switching operation in the full bridge circuit array 36a such that the pulse voltage that is output from each of all the full bridge circuits of the five stages has a duty ratio of 50%. In this manner, the output voltage obtained is as large as 50% of the maximum voltage.

In addition, for example, as illustrated in the lower part of FIG. 5, when the intensity of the control signal is large, the switching elements of each full bridge circuit perform switching operation in the full bridge circuit array 36a such that the pulse voltage that is output from each of all the full bridge circuits of the five stages has a duty ratio of 90%. In this manner, the output voltage obtained is as large as 90% of the maximum voltage.

It is known that a switching loss occurs when each switching element performs switching operation as described above. The switching loss in the present embodiment is a power loss that occurs when the switching element is switched from an ON state to an OFF state. Generally, a switching loss increases in proportion to the number of switching elements that perform switching operation.

For example, when the switching elements of each of all the full bridge circuits of five stages included in the full bridge circuit array 36a perform switching operation as described above, a switching loss occurs in each of all the five full bridge circuits. The switching loss increases the standby power of the gradient magnetic field power supply 30, and increases power consumption in the gradient magnetic field power supply 30.

However, for example, the output voltage that is as large as 10% of the maximum output as in the example illustrated in the upper part of FIG. 5 can be obtained by setting the duty ratio of each of the pulse voltages that are output from the three full bridge circuits to 17%. In addition, for example, the output voltage that is as large as 50% of the maximum output as in the example illustrated in the middle part of FIG. 5 can be obtained by setting the duty ratio of each of the pulse voltages output from the three full bridge circuits to 83%. Specifically, when the intensity of the voltage to be output to the gradient coil 2 is small or medium, the necessary output voltage can be obtained by operating only the three full bridge circuits.

For this reason, in the present embodiment, the gradient magnetic field power supply 30 switches the operation mode of the switching circuits between the first mode and the second mode, in accordance with the intensity of the voltage to be output to the gradient coil 2. The first mode is an operation mode of operating switching circuits of a first number among the switching circuits. The second mode is an operation mode of operating switching circuits of a second number that is smaller than the first number among the switching circuits.

For example, the gradient magnetic field power supply 30 operates all the full bridge circuits of the five stages as described above, as the first mode. This mode will be hereinafter referred to as an ordinary mode. In addition, for example, the gradient magnetic field power supply 30 operates the full bridge circuits of the three stages, as the second mode. This mode will be hereinafter referred to as a low-power mode. The gradient magnetic field power supply 30 switches the operation mode of each full bridge circuit between the ordinary mode and the low-power mode, in accordance with the intensity of the voltage to be output to the gradient coil 2.

A switching loss occurs in each of all the five full bridge circuits in the ordinary mode, while a switching loss occurs in each of only three full bridge circuits in the low-power mode. Accordingly, the switching loss occurring in the whole gradient magnetic field power supply 30 can be reduced while the full bridge circuits operate in the low-power mode, by switching the operation mode of each full bridge circuit between the ordinary mode and the low-power mode. This structure reduces power consumption caused by a switching loss in the gradient magnetic field power supply 30.

Specifically, the gradient magnetic field power supply 30 further includes an observing circuitry that switches the operation of the full bridge circuit array 36a between the ordinary mode and the low-power mode, in accordance with the intensity of the voltage to be output to the gradient coil 2.

Figure 6:
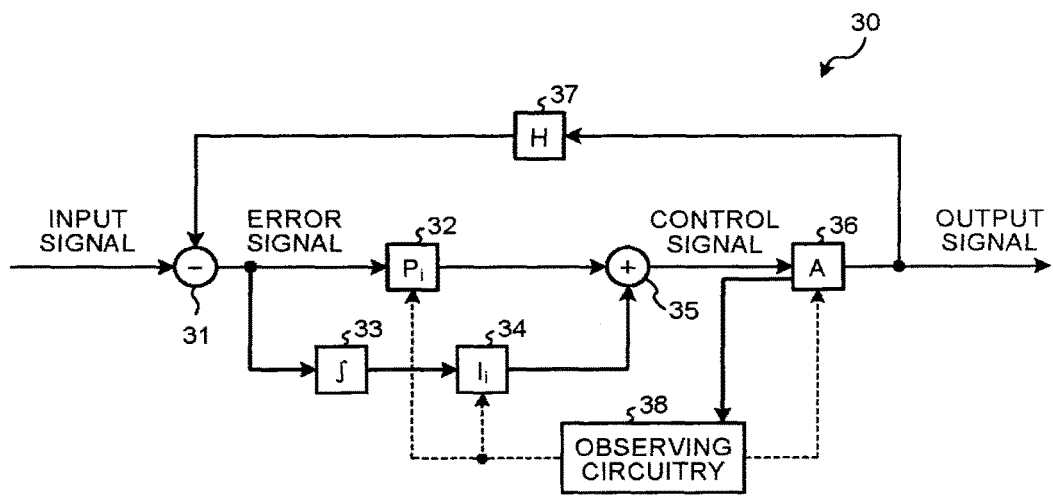
FIG. 6 is a diagram illustrating a configuration example obtained by adding an observing circuitry to the configuration example of the gradient magnetic field power supply illustrated in FIG. 2.

FIG. 6 is a configuration example obtained by adding an observing circuitry to the configuration example of the gradient magnetic field power supply 30 illustrated in FIG. 2. For example, as illustrated in FIG. 6, the gradient magnetic field power supply 30 further includes an observing circuitry 38, in addition to the subtracting circuitry 31, the proportionating circuitry 32, the integral term circuitry 33, the integrating circuitry 34, the adding circuitry 35, the amplifier circuitry 36, and the compensating circuitry 37 illustrated in FIG. 2.

A complex of circuitry including the subtracting circuitry 31, the proportionating circuitry 32, the integral term circuitry 33, the integrating circuitry 34, the adding circuitry 35, and the observing circuitry 38 in the first embodiment is an example of processing circuitry in the accompanying claims.

For example, in a state where the full bridge circuit array 36a operates in the ordinary mode, the observing circuitry 38 switches the operation mode of the full bridge circuit array 36a to the low-power mode, when the duty ratio of the pulse voltage that is output from the operating full bridge circuit becomes less than a first threshold. In addition, for example, in a state where the full bridge circuit array 36a operates in the low-power mode, the observing circuitry 38 switches the operation mode of the full bridge circuit array 36a to the ordinary mode, when the duty ratio of the pulse voltage that is output from the operating full bridge circuit becomes equal to or greater than a second threshold.

Figure 7:
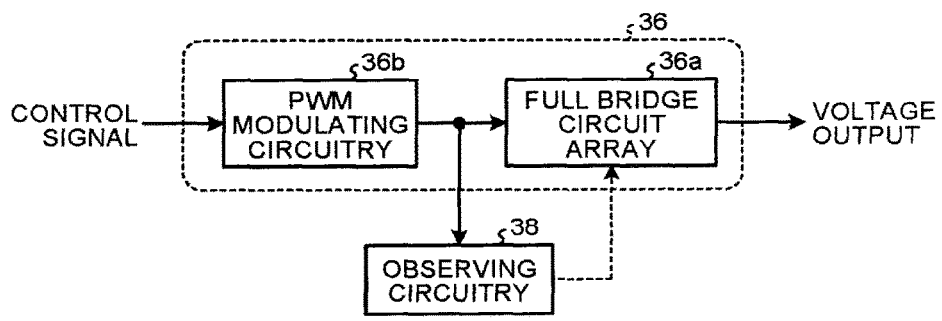
FIG. 7 is a diagram illustrating a configuration example obtained by adding the observing circuitry to the configuration example of the amplifier illustrated in FIG. 3.

FIG. 7 is a diagram illustrating a configuration example obtained by adding the observing circuitry to the configuration example of the amplifier circuitry 36 illustrated in FIG. 3. For example, as illustrated in FIG. 7, the amplifier circuitry 36 further includes the observing circuitry 38, in addition to the full bridge circuit array 36a and the PWM modulating circuitry 36b illustrated in FIG. 3.

For example, the observing circuitry 38 obtains a driving signal that is output from the PWM modulating circuitry 36b in real time, and calculates the duty ratios of the pulse voltages output from the respective full bridge circuits, for each of the full bridge circuits included in the full bridge circuit array 36a, based on the obtained driving signal. The observing circuitry 38 switches the operation mode of the full bridge circuit array 36a to the low-power mode, when the calculated duty ratio of each full bridge circuit becomes lower than the first threshold in the state where the full bridge circuit array 36a operates in the ordinary mode. In addition, the observing circuitry 38 switches the operation mode of the full bridge circuit array 36a to the ordinary mode, when the calculated duty ratio of each full bridge circuit becomes equal to or greater than the second threshold in the state where the full bridge circuit array 36a operates in the low-power mode.

Figure 8:
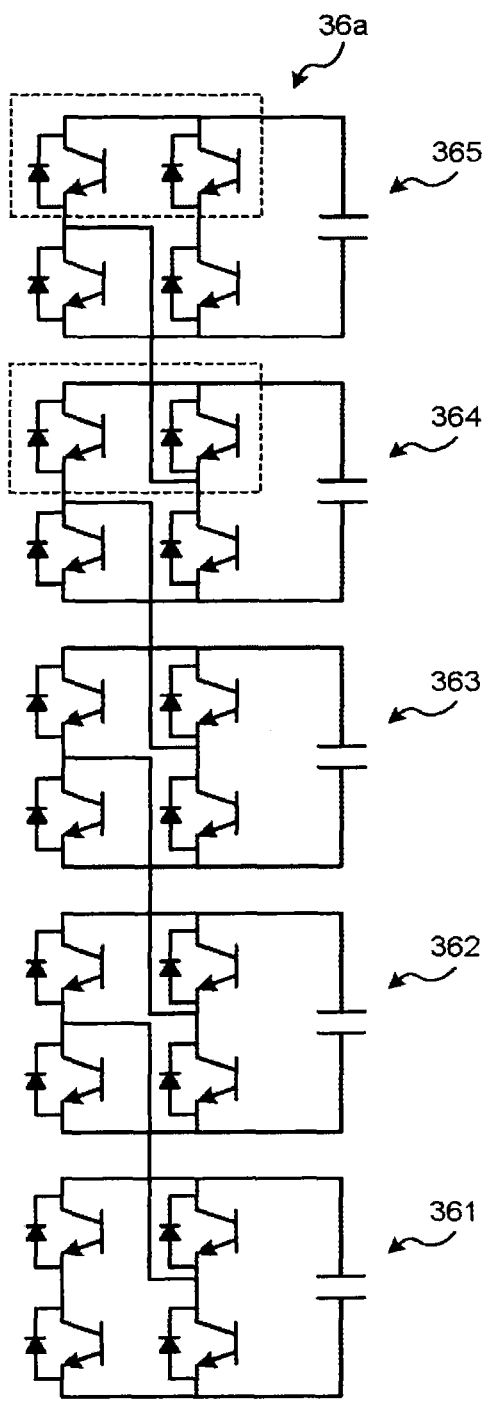
FIG. 8 is a diagram for explaining the structure of the full bridge circuit array in a low-power mode according to the first embodiment.

FIG. 8 is a diagram for explaining the structure of the full bridge circuit array 36a in the low-power mode according to the first embodiment. For example, as illustrated in FIG. 8, when the operation mode of the full bridge circuit array 36a is switched to the low-power mode, the observing circuitry 38 sets the full bridge circuit 364 in the fourth stage and the full bridge circuit 365 in the fifth stage to a regenerative mode, among the full bridge circuits 361 to 365 of the five stages included in the full bridge circuit array 36a.

The regenerative mode is a state where the full bridge circuit is separated from the power supply. For example, the observing circuitry 38 sets the full bridge circuit to the regenerative mode, by fixing the two switching elements (switching elements enclosed by a broken line illustrated in FIG. 8) that are arranged in parallel in a constant ON state, and fixing the other two switching elements in a constant OFF state, among the four switching elements included in the full bridge circuit. In the full bridge circuit that is set to the regenerative mode as described above, no switching operation occurs and thus no switching loss occurs.

Specifically, in the regenerative mode, the four switching elements included in the full bridge circuit are in a state of being completely stopped in the ON or OFF state, not in a standby (idling) state while performing switching operation of continuously switching between the ON state and the OFF state.

In the low-power mode, as described above, the full bridge circuits of the fourth stage and the fifth stage are set to the regenerative mode among the full bridge circuits of the five stages included in the full bridge circuit array 36a, to operate only the full bridge circuits of the first to third stages. As a result, the switching loss occurring in the whole gradient magnetic field power supply 30 is reduced to 60% in comparison with that in the case of operating all the five full bridge circuits.

By contrast, when the operation mode of the full bridge circuit array 36a is switched to the ordinary mode, the observing circuitry 38 sets all the five full bridge circuits 361 to 365 included in the full bridge circuit array 36a to the operating state. Specifically, the observing circuitry 38 cancels the regenerative mode of each of the fourth full bridge circuit 364 and the fifth full bridge circuit 365 that have been set to the regenerative mode in the low-power mode. In this manner, all the five full bridge circuits include in the full bridge circuit array 36a are operated.

As illustrated in FIG. 5, for example, the output voltage that is as large as 10% or 50% of the maximum output can be obtained by operating only the full bridge circuits of the three stages. For this reason, for example, the observing circuitry 38 sets the duty ratios serving as the first threshold and the second threshold to 60%.

Figure 9:
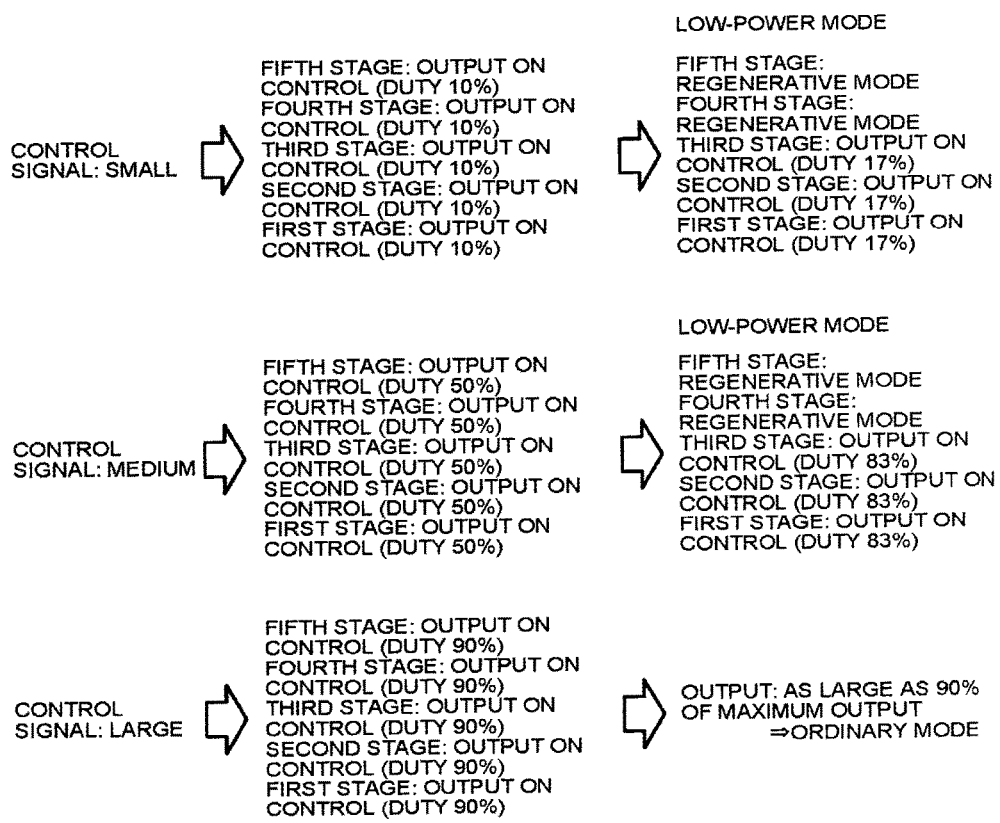
FIG. 9 is a diagram illustrating an example of relation between the control signal and the output voltage of the full bridge circuit array in the low-power mode according to the first embodiment.

FIG. 9 is a diagram illustrating an example of relation between the control signal and the output voltage in the full bridge circuit array 36a in the low-power mode according to the first embodiment. FIG. 9 illustrates an example similar to the example illustrated in FIG. 5.

For example, as illustrated in the center of the upper part of FIG. 9, suppose that the duty ratio of the pulse voltage that is output from each full bridge circuit is 10% in the state where the full bridge circuit array 36a operates in the ordinary mode. In such a case, the observing circuitry 38 switches the operation mode of the full bridge circuit array 36a to the low-power mode, because the duty ratio of the pulse voltage that is output from each of the operating full bridge circuits is less than 60%. Specifically, the observing circuitry 38 sets the full bridge circuits of the fourth and fifth stages to the regenerative mode. In this manner, each of the duty ratios of the pulse voltages that are output from the full bridge circuits of the first to third stages is controlled to be 17%.

For example, as illustrated in the center of the middle part of FIG. 9, suppose that the duty ratio of the pulse voltage that is output from each full bridge circuit is 50% in the state where the full bridge circuit array 36a operates in the ordinary mode. In such a case, the observing circuitry 38 switches the operation mode of the full bridge circuit array 36a to the low-power mode, because the duty ratio of the pulse voltage that is output from each of the operating full bridge circuits is less than 60%. Specifically, the observing circuitry 38 sets the full bridge circuits of the fourth and fifth stages to the regenerative mode. In this manner, each of the duty ratios of the pulse voltages that are output from the full bridge circuits of the first to third stages is controlled to be 83%.

For example, as illustrated in the center of the lower part of FIG. 9, suppose that the duty ratio of the pulse voltage that is output from each full bridge circuit is 90% in the state where the full bridge circuit array 36a operates in the ordinary mode. In such a case, the observing circuitry 38 maintains the operation mode of the full bridge circuit array 36a at the ordinary mode, because the duty ratio of the pulse voltage that is output from each of the operating full bridge circuits is equal to or greater than 60%.

As described above, the observing circuitry 38 switches the operation mode of the full bridge circuit array 36a between the ordinary mode and the low-power mode, based on the operation mode in operation, that is, the number of the operating full bridge circuits, and the duty ratios of the pulse voltages that are output from the operating full bridge circuits. This structure enables reduction in the number of the operating switching elements in accordance with the intensity of the voltage to be output to the gradient coil 2, and reduction in power consumption caused by a switching loss in the gradient magnetic field power supply 30.

Because the number of stages of the operating full bridge circuits differs between the ordinary mode and the low-power mode, the operations of the full bridge circuit array 36a and the PWM modulating circuitry 36b in the amplifier circuitry 36 differ between the modes. For this reason, it is desirable that the observing circuitry 38 also switches the proportional gain of the proportionating circuitry 32 and the integral gain of the integrating circuitry 34, simultaneously with switching of the operation mode of the full bridge circuit array 36a. In such a case, the proportionating circuitry 32 holds in advance proportional gains suitable for the respective numbers of stages to be switched. The integrating circuitry 34 also holds in advance integral gains suitable for the respective numbers of stages to be switched.

As described above, according to the first embodiment, the operation mode of the full bridge circuit array 36a is switched between the ordinary mode and the low-power mode, in accordance with the intensity of the voltage to be output to the gradient coil 2, to reduce power consumption caused by a switching loss in the gradient magnetic field power supply 30.

Figure 10:
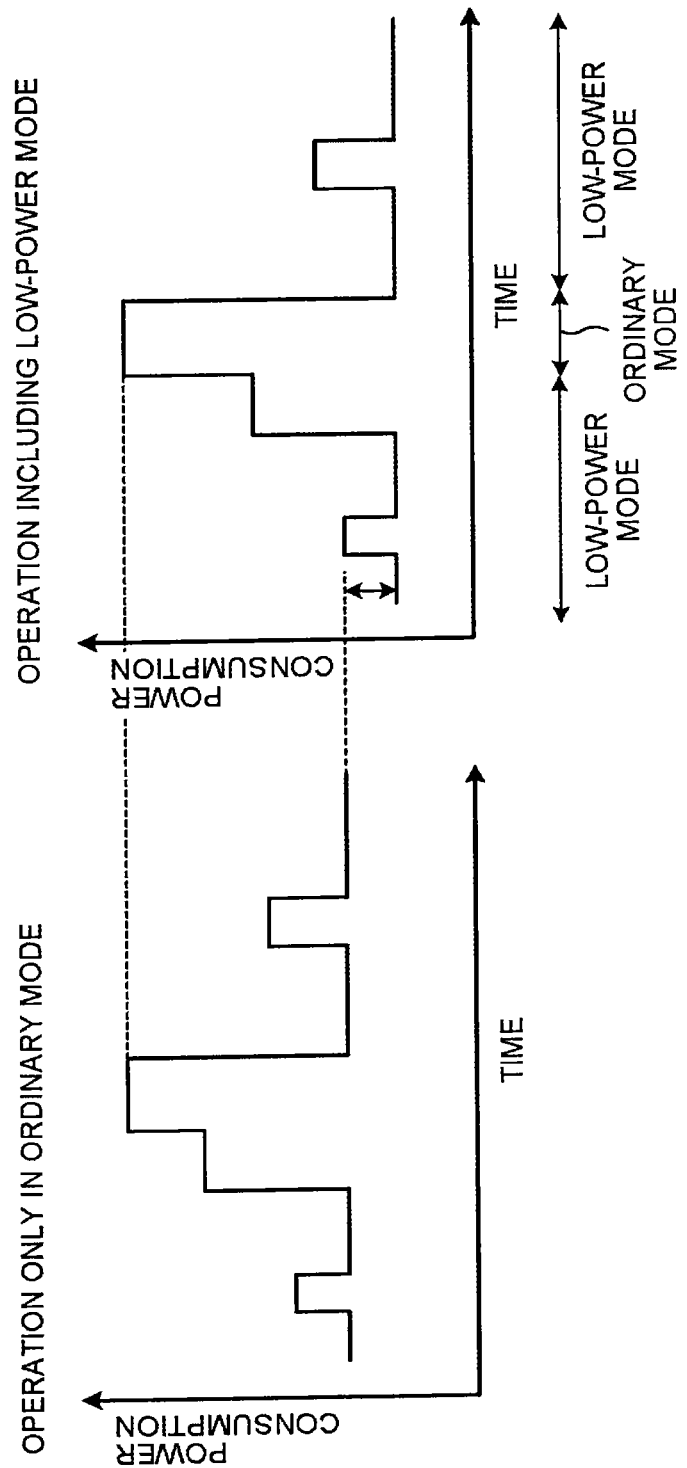
FIG. 10 is a diagram illustrating changes in power consumption in the gradient magnetic field power supply according to the first embodiment.

FIG. 10 is a diagram illustrating changes in power consumption in the gradient magnetic field power supply 30 according to the first embodiment. As illustrated in FIG. 10, according to the first embodiment, the power consumption of the gradient magnetic field power supply 30 can be reduced while the full bridge circuit array 36a is operated in the low-power mode, in comparison with the case of operating the full bridge circuit array 36a only in the ordinary mode, by switching the operation mode of the full bridge circuit array 36a between the ordinary mode and the low-power mode. Consequently, this structure reduces the power consumption of the whole gradient magnetic field power supply 30.

Although the first embodiment described above illustrates the example of the case of setting the first threshold and the second threshold used by the observing circuitry 38 to the same value, the present embodiments are not limited thereto. For example, the first threshold and the second threshold may be set to different values. For example, the first threshold may be set to a large value to advance the timing of switching from the ordinary mode to the low-power mode. Conversely, the first threshold may be set to a small value to delay the timing of switching from the ordinary mode to the low-power mode. In addition, for example, the second threshold may be set to a small value to advance the timing of switching from the low-power mode to the ordinary mode. Conversely, for example, the second threshold may be set to a large value to delay the timing of switching from the ordinary mode to the low-power mode. Accordingly, the power consumption of the gradient magnetic field power supply 30 can be reduced more effectively, by adjusting the first threshold and the second threshold to optimum values based on the actual measurement value of the power consumption.

In addition, although the above first embodiment illustrates the example of the case of switching the operation mode of the full bridge circuits, based on the operation mode in operation, that is, the number of the operating full bridge circuits and the duty ratios of the pulse voltages that are output from the operating full bridge circuits, the method for switching the operation mode is not limited thereto. The following is explanation of other embodiments having different methods for switching the operation mode.

Second Embodiment

The second embodiment illustrates an example of the case of switching the operation mode of the full bridge circuits based on an input signal that is input to the gradient magnetic field power supply 30. Gradient magnetic field power supplies that are used for MRI apparatuses have a characteristic that a gradient coil, that is, an inductor is connected thereto as a load. Using the characteristic enables estimation of the intensity of the output voltage in advance, based on the input signal that is input to the gradient magnetic field power supply.

The configuration of the MRI apparatus according to the second embodiment is basically the same as that illustrated in FIG. 1, and different therefrom only in the structure of the gradient magnetic field power supply. For this reason, the following is explanation of the configuration of the gradient magnetic field power supply according to the second embodiment.

Figure 11:
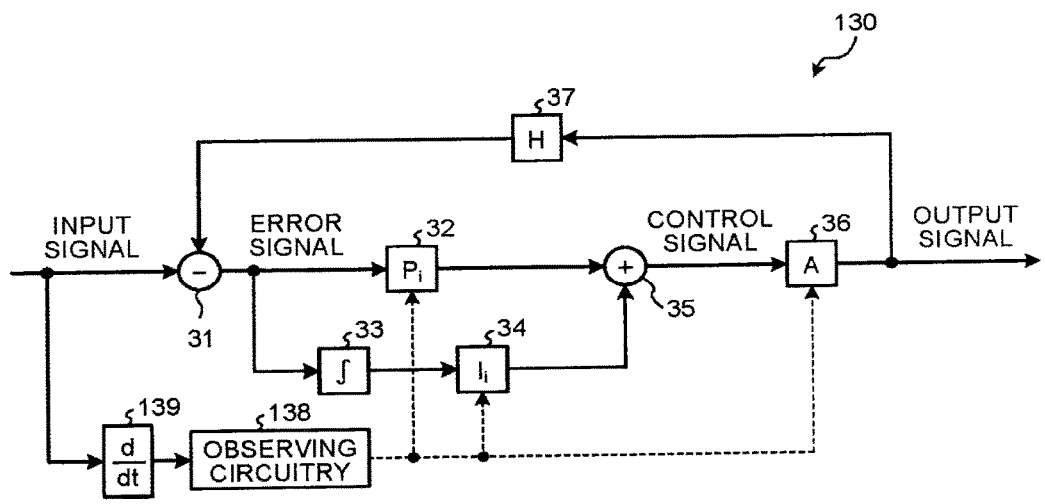
FIG. 11 is a diagram illustrating a configuration example of a gradient magnetic field power supply according to a second embodiment.

FIG. 11 is a diagram illustrating a configuration example of a gradient magnetic field power supply 130 according to the second embodiment. For example, as illustrated in FIG. 11, the gradient magnetic field power supply 130 further includes a observing circuitry 138 and a differentiating circuitry 139, in addition to the subtracting circuitry 31, the proportionating circuitry 32, the integral term circuitry 33, the integrating circuitry 34, the adding circuitry 35, the amplifier circuitry 36, and the compensating circuitry 37 illustrated in FIG. 2. The observing circuitry 138 includes the full bridge circuit array 36a and the PWM modulating circuitry 36b illustrated in FIG. 3.

A complex of circuitry including the subtracting circuitry 31, the proportionating circuitry 32, the integral term circuitry 33, the integrating circuitry 34, the adding circuitry 35, the observing circuitry 138, and the differentiating circuitry 139 in the second embodiment is an example of processing circuitry in the accompanying claims.

The differentiating circuitry 139 calculates a differential value of the input signal transmitted from the sequence controlling circuitry 10. The input signal is a signal that indicates a waveform of the gradient magnetic field generated by the gradient coil 2, and simulates the waveform of the gradient magnetic field with a current. The differential value of the input signal is a time differential value for temporal change in the signal value that indicates the waveform of the gradient magnetic field.

The observing circuitry 138 operates the full bridge circuits in the ordinary mode when the differential value calculated by the differentiating circuitry 139 is equal to or greater than a predetermined threshold, and operates the full bridge circuits in the low-power mode when the differential value calculated by the differentiating circuitry 139 is less than the predetermined threshold, to switch the operation mode of the full bridge circuit array 36a.

In the same manner as the first embodiment, it is desirable that the observing circuitry 138 also switches the proportional gain of the proportionating circuitry 32 and the integral gain of the integrating circuitry 34, simultaneously with switching of the operation mode of the full bridge circuit array 36a.

Third Embodiment

The third embodiment illustrates an example of the case of switching the operation mode of the full bridge circuits, based on a slew rate of the gradient magnetic field generated by the gradient coil 2. The slew rate of the gradient magnetic field is determined based on imaging conditions that are set by the operator for each imaging. Generally, the gradient magnetic field used in an MRI apparatus has a trapezoidal waveform, and the output voltage to the gradient coil increases in the rising part of the trapezoid. For this reason, the intensity of the output voltage can be estimated in advance based on the slew rate of the rising part of the gradient magnetic field generated by the gradient coil 2.

The configuration of the MRI apparatus according to the third embodiment is basically the same as that illustrated in FIG. 1, and different therefrom only in the structure of the gradient magnetic field power supply. For this reason, the following is explanation of the configuration of the gradient magnetic field power supply according to the third embodiment.

Figure 12:
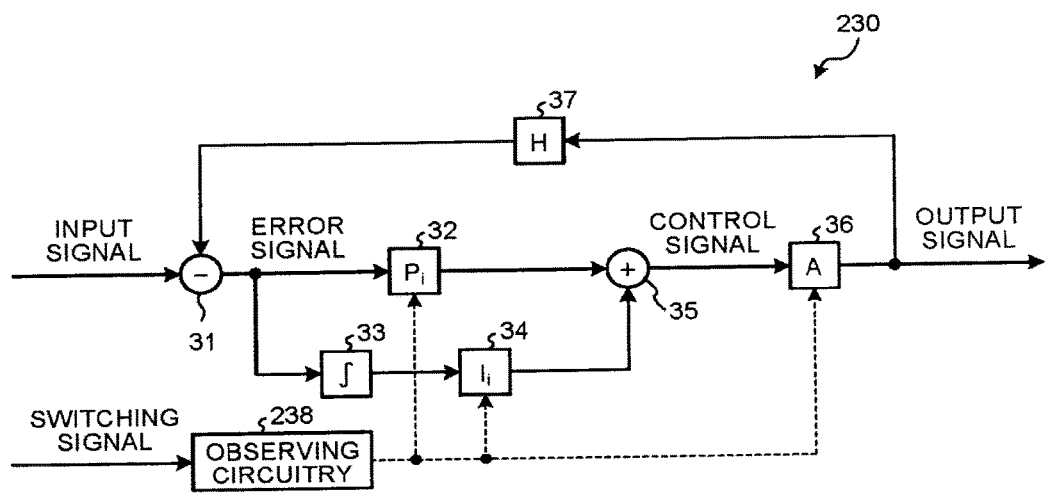
FIG. 12 is a diagram illustrating a configuration, example of a gradient magnetic field power supply according to a third embodiment.

FIG. 12 is a diagram illustrating a configuration example of a gradient magnetic field power supply 230 according to the third embodiment. For example, as illustrated in FIG. 12, the gradient magnetic field power supply 230 further includes an observing circuitry 238, in addition to the subtracting circuitry 31, the proportionating circuitry 32, the integral term circuitry 33, the integrating circuitry 34, the adding circuitry 35, the amplifier circuitry 36, and the compensating circuitry 37 illustrated in FIG. 2. The observing circuitry 238 includes the full bridge circuit array 36a and the PWM modulating circuitry 36b illustrated in FIG. 3.

A complex of circuitry including the subtracting circuitry 31, the proportionating circuitry 32, the integral term circuitry 33, the integrating circuitry 34, the adding circuitry 35, and the observing circuitry 238 in the third embodiment is an example of processing circuitry in the accompanying claims.

The observing circuitry 238 operates the full bridge circuits in the ordinary mode when the slew rate of the gradient magnetic field generated by the gradient coil 2 is equal to or greater than a predetermined threshold, and operates the full bridge circuits in the low-power mode when the slew rate is less than the predetermined threshold, to switch the operation mode of the full bridge circuit array 36a.

For example, the sequence controlling circuitry 10 calculates the slew rate of the gradient magnetic field generated by the gradient coil 2, based on sequence execution data transmitted from the computer system 20. In addition, the sequence controlling circuitry 10 determines in which of the ordinary mode and the low-power mode the full bridge circuit array 36a of the gradient magnetic field power supply 230 is to be operated, based on the calculated slew rate. Thereafter, the sequence controlling circuitry 10 transmits a switching signal that indicates a result of the determination to the gradient magnetic field power supply 230. In such a case, the observing circuitry 238 of the gradient magnetic field power supply 230 switches the operation mode of the full bridge circuit array 36a in accordance with the switching signal transmitted from the sequence controlling circuitry 10.

Although the present embodiment illustrates the example of the case where the sequence controlling circuitry 10 determines the operation mode of the full bridge circuit array 36a, for example, the controlling circuitry 26 of the computer system 20 may determine the operation mode of the full bridge circuit array 36a. In such a case, the controlling circuitry 26 calculates the slew rate of the gradient magnetic field generated by the gradient coil 2, based on the imaging conditions that are set by the operator. In addition, the controlling circuitry 26 determines in which of the ordinary mode and the low-power mode the full bridge circuit array 36a of the gradient magnetic field power supply 230 is to be operated, based on the calculated slew rate. Thereafter, the controlling circuitry 26 transmits a switching signal that indicates a result of the determination to the gradient magnetic field power supply 230 via the sequence controlling circuitry 10.

In addition, for example, the sequence controlling circuitry 10 or the controlling circuitry 26 may transmit information that indicates the slew rate of the gradient magnetic field to the gradient magnetic field power supply 230, based on the imaging conditions. In such a case, the observing circuitry 238 of the gradient magnetic field power supply 230 determines in which of the ordinary mode and the low-power mode the full bridge circuit array 36a is to be operated, based on the information that indicates the slew rate and is transmitted from the sequence controlling circuitry 10 or the controlling circuitry 26, and switches the operation mode of the full bridge circuit array 36a in accordance with the determination result.

In the same manner as the first embodiment, it is desirable that the observing circuitry 238 also switches the proportional gain of the proportionating circuitry 32 and the integral gain of the integrating circuitry 34, simultaneously with switching of the operation mode of the full bridge circuit array 36a.

Although the first to third embodiments explained above illustrate the examples of switching the operation mode of the full bridge circuit array 36a between the ordinary mode and the low-power mode, the operation modes to be switched are not limited to two modes. For example, the observing circuitry may switch the operation mode of the full bridge circuit array 36a between three or more operation modes. In such a case, the number of stages of full bridge circuits to be operated is changed in a stepped manner between the operation modes. For example, all the full bridge circuits of the five stages are operated in the ordinary mode, the full bridge circuits of the three stages are operated in the first low-power mode, and the full bridge circuit of one stage is operated in the second low-power mode. In addition, for example, the observing circuitry switches the operation modes using two or more thresholds.

Besides, in the first to third embodiments described above, the components illustrated in FIG. 2, FIG. 3, FIG. 6, FIG. 7, FIG. 11, and FIG. 12 may be realized as hardware serving as independent circuits, or may be realized as software by executing a computer program that defines the procedure of the processing executed by the components with a processor or a memory.

Specifically, the components illustrated in FIG. 2, FIG. 3, FIG. 6, FIG. 7, FIG. 11, and FIG. 12 are realized by a circuitry. For example, the circuitry achieves the functions of the components with a combination of a plurality of hardware logic circuits. In addition, for example, the circuitry is a processor such as a CPU and an MPU, and a memory. In such a case, the memory stores a plurality of instructions that define the procedure of the processing executed by the components and are executable by a processor. The processor executes the processing by executing the instructions stored in the memory.

That is, the respective components in the respective apparatuses shown in the explanation of the first to the second embodiments are of functional concept, and it is not necessarily required to be physically configured as shown in the drawings. Specifically, a specific form of distribution and integration of the respective devices are not limited to the ones shown in the drawings, and it can be configured such that all or a part thereof is functionally or physically distributed or integrated in arbitrary units according to various kinds of load and usage condition and the like. Furthermore, as for the respective processing functions of the respective devices, all or an arbitrary part thereof can be implemented by a central processing unit (CPU) and a computer program that is analyzed and executed by the CPU, or can be implemented as hardware by wired logic.

For example, a part of the components included in the gradient magnetic field power supplies illustrated in FIGS. 2, 6, 11 and 12 may be integrated into one processing circuit that implements the respective functions. The following describes embodiments, as fourth to sixth embodiments in which such processing circuit is used.

Fourth Embodiment

Figure 13:
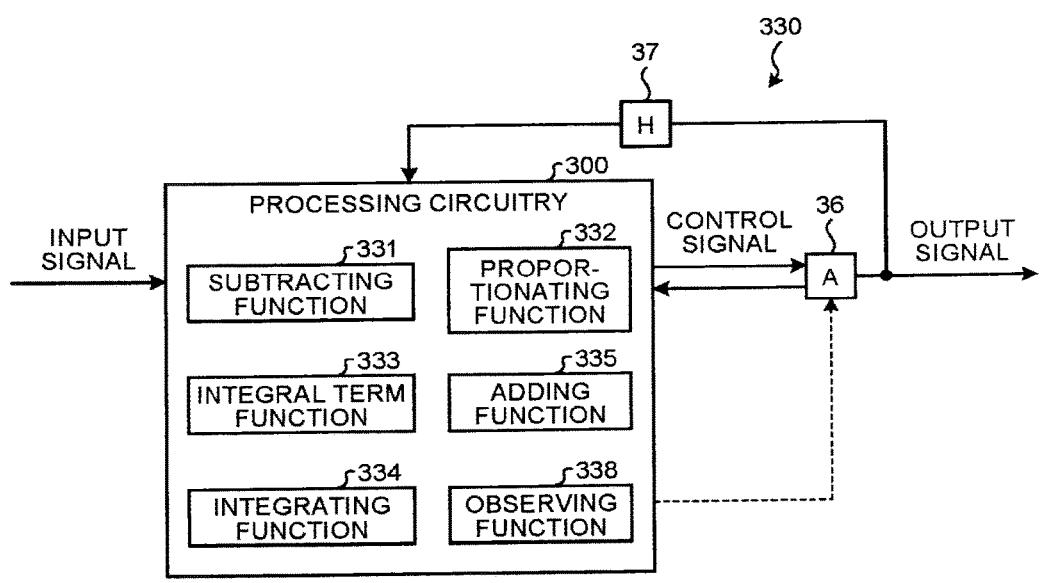
FIG. 13 is a diagram illustrating a configuration example of a gradient magnetic field power supply according to a fourth embodiment.

FIG. 13 is a diagram illustrating a configuration example of a gradient magnetic field power supply 330 according to a fourth embodiment. For example, the gradient magnetic field power supply 30 illustrated in FIGS. 2 and 6 may be configured as illustrated in FIG. 13. The embodiment described below, circuitry illustrated in FIG. 13 and having the same functions as the circuitry described in the above embodiments are assigned the same reference numerals, and detailed descriptions thereof are omitted.

As illustrated in FIG. 13, the gradient magnetic field power supply 330 includes a processing circuitry 300, an amplifier circuitry 36, and a compensating circuitry 37.

The processing circuitry 300 in the fourth embodiment is an example of processing circuitry in the accompanying claims.

The processing circuitry 300 implements a subtracting function 331, a proportionating function 332, an integral term function 333, an integrating function 334, an adding function 335, and an observing function 338. The subtracting function 331, the proportionating function 332, the integral term function 333, the integrating function 334, the adding function 335, and the observing function 338 correspond to the functions implemented by the subtracting circuitry 31, the proportionating circuitry 32, the integral term circuitry 33, the integrating circuitry 34, the adding circuitry 35, and the observing circuitry 38, respectively, illustrated in FIGS. 2 and 6.

For example, each of the respective processing functions performed by the subtracting function 331, the proportionating function 332, the integral term function 333, the integrating function 334, the adding function 335, and the observing function 338 illustrated in FIG. 13 is stored in the memory circuitry 23 in a form of a computer-executable program. The processing circuitry 300 is a processor that loads programs from the memory circuitry 23 and executes the programs so as to implement the respective functions corresponding to the programs. In other words, the processing circuitry 300 that has loaded the programs has the functions illustrated in the processing circuitry 300 in FIG. 13.

Figure 14:
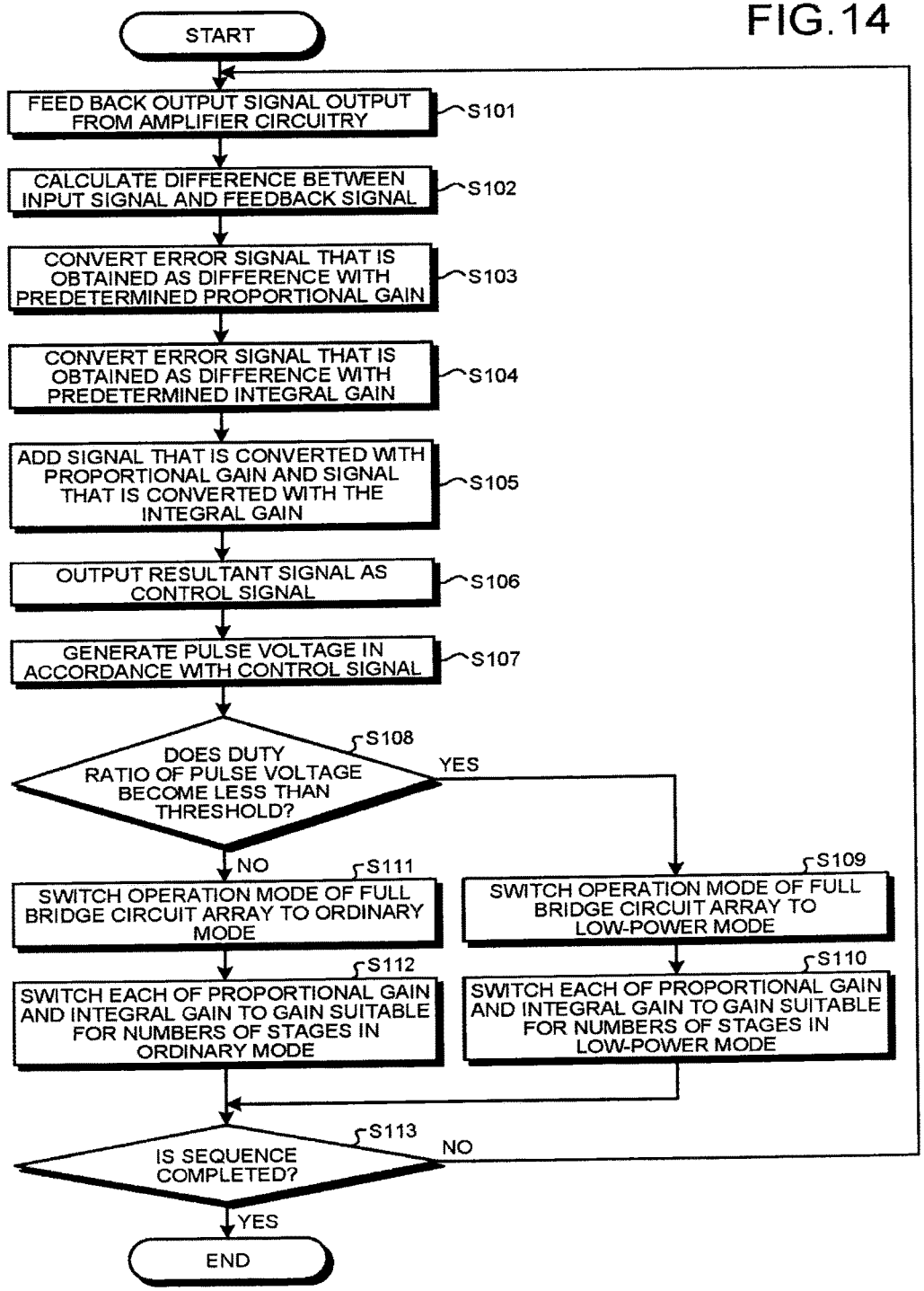
FIG. 14 is a flowchart of a flow of processes executed by the gradient magnetic field power supply according to the forth embodiment.

FIG. 14 is a flowchart of the flow of processes executed by the gradient magnetic field power supply 330 according to the forth embodiment.

For example, as illustrated in FIG. 3, in the gradient magnetic field power supply 330 according to the forth embodiment, the compensating circuitry 37 feeds back the output signal that is output from the amplifier circuitry 36 to the processing circuitry 300 (Step S101).

The processing circuitry 300 then calculates difference between the input signal transmitted from the sequence controlling circuitry 10 and the feedback signal transmitted from the compensating circuitry 37 (Step S102). The processing circuitry 300 then converts error signal that is obtained as the difference with a predetermined proportional gain (Step S103). The processing circuitry 300 also converts the error signal that is obtained as the difference with a predetermined integral gain (Step S104). The processing circuitry 300 then adds the signal that is converted with the proportional gain and the signal that is converted with the integral gain (Step S105). The processing circuitry 300 then outputs the resultant signal as a control signal to the amplifier circuitry 36 (Step S106).

The amplifier circuitry 36 then generates a pulse voltage obtained by modulating the pulse width thereof in accordance with the control signal that is output from the adding circuitry 35, and outputs the generated pulse voltage as an output signal (Step S107).

Then, in a state where the full bridge circuit array 36a operates in the ordinary mode, when the duty ratio of the pulse voltage that is output from the operating full bridge circuit becomes less than a threshold (Yes at Step S108), the processing circuitry 300 switches the operation mode of the full bridge circuit array 36a to the low-power mode (Step S109). The processing circuitry 300 also switches each of the proportional gain and the integral gain used for converting the error signal to a gain suitable for the numbers of stages in the low-power mode, simultaneously with switching of the operation mode of the full bridge circuit array 36a to the low-power mode (Step S110).

In addition, in a state where the full bridge circuit array 36a operates in the low-power mode, when the duty ratio of the pulse voltage that is output from the operating full bridge circuit becomes equal to or greater than the threshold (No at Step S108), the processing circuitry 300 switches the operation mode of the full bridge circuit array 36a to the ordinary mode (Step S111). The processing circuitry 300 also switches each of the proportional gain and the integral gain used for converting the error signal to a gain suitable for the numbers of stages in the ordinary mode, simultaneously with switching of the operation mode of the full bridge circuit array 36a to the ordinary mode (Step S112).

The gradient magnetic field power supply 330 repeatedly performs the series of processes from Step S101 to S113 described above until an execution of a sequence is completed. Then, when the sequence is completed, the gradient magnetic field power supply 330 terminates the series of the processes.

In the above processes, Step S102 illustrated in FIG. 14 is a step that is implemented by the processing circuitry 300 loading the program corresponding to the subtracting function 331 from the memory circuitry 23 and executing the program. Step S103 illustrated in FIG. 14 is a step that is implemented by the processing circuitry 300 loading the program corresponding to the proportionating function 332 from the memory circuitry 23 and executing the program. Step S104 illustrated in FIG. 14 is a step that is implemented by the processing circuitry 300 loading the programs corresponding to the integral term function 333 and the integrating function 334 from the memory circuitry 23 and executing the programs. Steps S105 and S106 illustrated in FIG. 14 are steps that are implemented by the processing circuitry 300 loading the program corresponding to the adding function 335 from the memory circuitry 23 and executing the program. Steps S108 to S112 illustrated in FIG. 14 are steps that are implemented by the processing circuitry 300 loading the program corresponding to the observing function 338 from the memory circuitry 23 and executing the program.

Although the processing functions performed by the subtracting function 331, the proportionating function 332, the integral term function 333, the integrating function 334, the adding function 335, and the observing function 338 are described as being implemented in the single processing circuit. The functions, however, may be implemented by configuring a processing circuit by combining a plurality of separate processors and causing each of the processors to execute a program.

Fifth Embodiment

Figure 15:
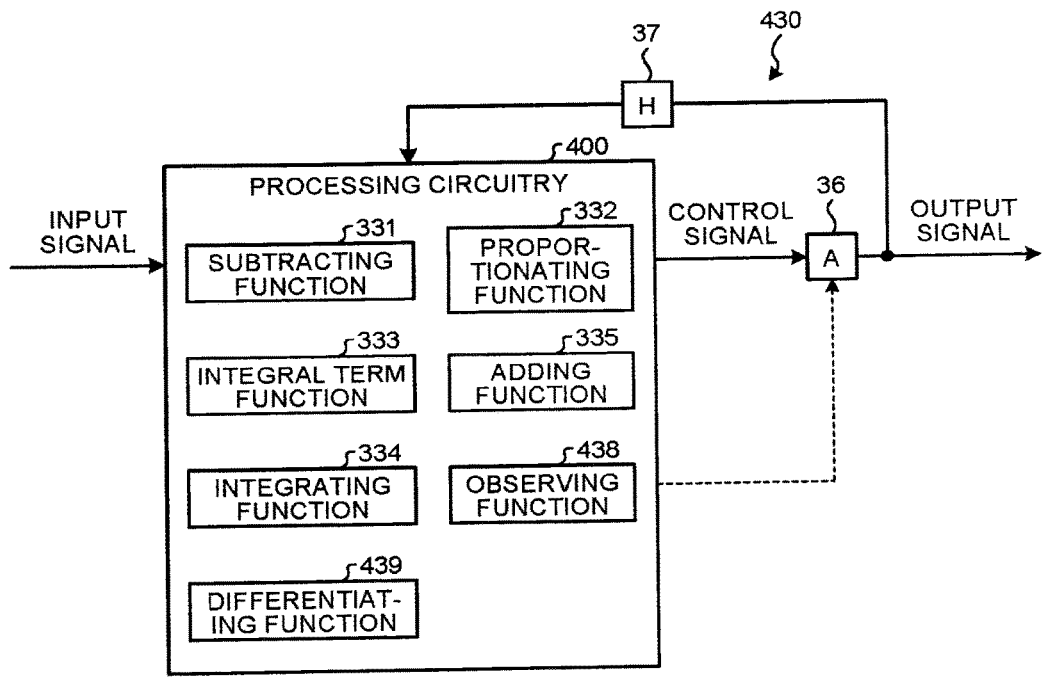
FIG. 15 is a diagram illustrating a configuration example of a gradient magnetic field power supply according to a fifth embodiment.

FIG. 15 is a diagram illustrating a configuration example of a gradient magnetic field power supply 430 according to a fifth embodiment. For example, the gradient magnetic field power supply 130 illustrated in FIG. 11 6 may be configured as illustrated in FIG. 15. The embodiment described below, circuitry illustrated in FIG. 15 and having the same functions as the circuitry described in the above embodiments are assigned the same reference numerals, and detailed descriptions thereof are omitted.

As illustrated in FIG. 15, the gradient magnetic field power supply 430 includes a processing circuitry 400, an amplifier circuitry 36, and a compensating circuitry 37.

The processing circuitry 400 in the fifth embodiment in an example of processing circuitry in the accompanying claims.

The processing circuitry 400 implements a subtracting function 331, a proportionating function 332, an integral term function 333, an integrating function 334, an adding function 335, an observing function 438, and a differentiating function 439. The subtracting function 331, the proportionating function 332, the integral term function 333, the integrating function 334, the adding function 335, the observing function 438, the differentiating function 439 correspond to the functions implemented by the subtracting circuitry 31, the proportionating circuitry 32, the integral term circuitry 33, the integrating circuitry 34, the adding circuitry 35, the observing circuitry 138, and the differentiating circuitry 139 respectively, illustrated in FIG. 11.

For example, each of the respective processing functions performed by the subtracting function 331, the proportionating function 332, the integral term function 333, the integrating function 334, the adding function 335, the observing function 438, and the differentiating function 439 illustrated in FIG. 15 is stored in the memory circuitry 23 in a form of a computer-executable program. The processing circuitry 400 is a processor that loads programs from the memory circuitry 23 and executes the programs so as to implement the respective functions corresponding to the programs. In other words, the processing circuitry 400 that has loaded the programs has the functions illustrated in the processing circuitry 400 in FIG. 15.

The processing circuitry 400 executes the similar processes as the processes that are illustrated in FIG. 14 excepting the steps of Step S108, S109 and S110. That is, the processing circuitry 400 switches the operation mode of the full bridge circuits based on an input signal that is input to the gradient magnetic field power supply 430 in the similar way as the second embodiment, instead of switching the operation mode based on the duty ratio of the pulse voltage that is output from each of the full bridge circuits.

Specifically, the processing circuitry 400 further calculates a differential value of the input signal. Then, the processing circuitry 400 operates the full bridge circuits in the ordinary mode when the differential value is equal to or greater than a predetermined threshold, and operates the full bridge circuits in the low-power mode when the differential value is less than the predetermined threshold, to switch the operation mode of the full bridge circuit array 36a.

The step of the process for switching the operation mode described above is a step that is implemented by the processing circuitry 400 loading the program corresponding to the observing function 438 from the memory circuitry 23 and executing the program.

Although the processing functions performed by the subtracting function 331, the proportionating function 332, the integral term function 333, the integrating function 334, the adding function 335, the observing function 438, and the differentiating function 439 are described as being implemented in the single processing circuit. The functions, however, may be implemented by configuring a processing circuit by combining a plurality of separate processors and causing each of the processors to execute a program.

Sixth Embodiment

Figure 16:
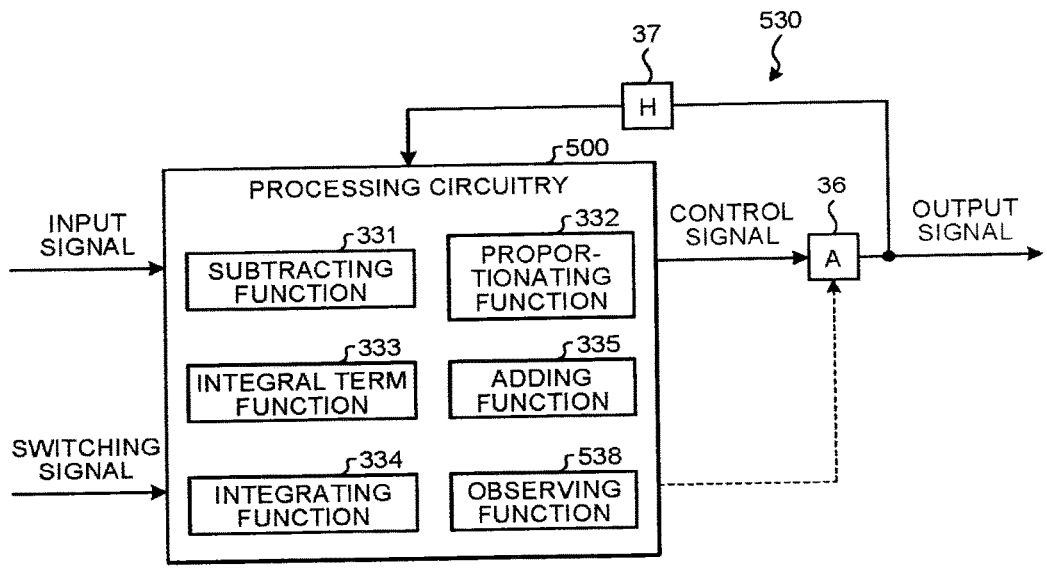
FIG. 16 is a diagram illustrating a configuration example of a gradient magnetic field power supply according to a sixth embodiment.

FIG. 16 is a diagram illustrating a configuration example of a gradient magnetic field power supply 530 according to a sixth embodiment. For example, the gradient magnetic field power supply 230 illustrated in FIG. 12 may be configured as illustrated in FIG. 16. The embodiment described below, circuitry illustrated in FIG. 16 and having the same functions as the circuitry described in the above embodiments are assigned the same reference numerals, and detailed descriptions thereof are omitted.

As illustrated in FIG. 16, the gradient magnetic field power supply 530 includes a processing circuitry 500, an amplifier circuitry 36, and a compensating circuitry 37.

The processing circuitry 500 in the sixth embodiment is an example of processing circuitry in the accompanying claims.

The processing circuitry 500 implements a subtracting function 331, a proportionating function 332, an integral term function 333, an integrating function 334, an adding function 335, and an observing function 538. The subtracting function 331, the proportionating function 332, the integral term function 333, the integrating function 334, the adding function 335, and the observing function 538 correspond to the functions implemented by the subtracting circuitry 31, the proportionating circuitry 32, the integral term circuitry 33, the integrating circuitry 34, the adding circuitry 35, and the observing circuitry 238, respectively, illustrated in FIG. 12.

For example, each of the respective processing functions performed by the subtracting function 331, the proportionating function 332, the integral term function 333, the integrating function 334, the adding function 335, and the observing function 538 illustrated in FIG. 13 is stored in the memory circuitry 23 in a form of a computer-executable program. The processing circuitry 500 is a processor that loads programs from the memory circuitry 23 and executes the programs so as to implement the respective functions corresponding to the programs. In other words, the processing circuitry 500 that has loaded the programs has the functions illustrated in the processing circuitry 500 in FIG. 16.

The processing circuitry 500 executes the similar processes as the processes that are illustrated in FIG. 14 excepting the steps of Step S108, S109 and S110. That is, the processing circuitry 500 switches the operation mode of the full bridge circuits based on a slew rate of the gradient magnetic field generated by the gradient coil 2 in the similar way as the third embodiment, instead of switching the operation mode based on the duty ratio of the pulse voltage that is output from each of the full bridge circuits.

Specifically, the processing circuitry 500 operates the full bridge circuits in the ordinary mode when the slew rate of the gradient magnetic field generated by the gradient coil 2 is equal to or greater than a predetermined threshold, and operates the full bridge circuits in the low-power mode when the slew rate is less than the predetermined threshold, to switch the operation mode of the full bridge circuit array 36a.

The step of the process for switching the operation mode described above is a step that is implemented by the processing circuitry 500 loading the program corresponding to the observing function 538 from the memory circuitry 23 and executing the program.

Although the processing functions performed by the subtracting function 331, the proportionating function 332, the integral term function 333, the integrating function 334, the adding function 335, and the observing function 5338 are described as being implemented in the single processing circuit. The functions, however, may be implemented by configuring a processing circuit by combining a plurality of separate processors and causing each of the processors to execute a program.

The first to sixth embodiments has been described above. In the above embodiments, the term "processor" used in the above description means, for example, a central preprocess unit (CPU) and a graphics processing unit (GPU), or a circuit such as an application specific integrated circuit (ASIC), a programmable logic device (for example, a simple programmable logic device (SPLD)), a complex programmable logic device (CPLD), and a field programmable gate array (FPGA). The processor implements a function by loading and executing a program stored in a storage circuit. Instead of being stored in a storage circuit, the program may be built directly in a circuit of the processor. In this case, the processor implements a function by loading and executing the program built in the circuit. The processors in the present embodiment are not limited to a case in which each of the processors is configured as a single circuit. A plurality of separate circuits may be combined as one processor that implements the respective functions.

At least one of the present embodiments explained above enables reduction in power consumption caused by a switching loss in the gradient magnetic field power supply.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
a gradient magnetic field power supply configured to supply power to a gradient coil, the gradient magnetic field power supply including
a plurality of switching circuits, each of which includes a plurality of switching elements, and is configured to output a predetermined pulse voltage by performing a switching operation of each of the switching elements; and
processing circuitry configured to switch an operation mode between a first mode and a second mode in accordance with an intensity of a voltage to be output to the gradient coil, the first mode causing switching circuits of a first number to perform the switching operation of each of the switching elements among the plurality of switching circuits, and the second mode causing switching circuits of a second number smaller than the first number to perform the switching operation of each of the switching elements among the plurality of switching circuits,
wherein the processing circuitry is further configured to switch the operation mode based on at least one of a duty ratio of the pulse voltage that is output from an operating switching circuit and a slew rate of a gradient magnetic field generated by the gradient coil.

2. The magnetic resonance imaging apparatus according to claim 1, wherein the processing circuitry is further configured to switch the operation mode to the second mode when a duty ratio of the pulse voltage that is output from an operating switching circuit becomes less than a first threshold in a state where the switching circuits operate in the first mode, and switches the operation mode to the first mode when the duty ratio of the pulse voltage that is output from the operating switching circuit becomes equal to or greater than a second threshold in a state where the switching circuits operate in the second mode.

3. The magnetic resonance imaging apparatus according to claim 1, wherein
the gradient magnetic field power supply is further configured to output the voltage to the gradient coil based on an input signal that indicates a waveform of a gradient magnetic field generated by the gradient coil, and
the processing circuitry is further configured to:
calculate a differential value of the input signal; and
operate the switching circuits in the first mode when the differential value is equal to or greater than a predetermined threshold, and operate the switching circuits in the second mode when the differential value is less than the predetermined threshold, to switch the operation mode.

4. The magnetic resonance imaging apparatus according to claim 1, wherein the processing circuitry is further configured to operate the switching circuits in the first mode when a slew rate of a gradient magnetic field generated by the gradient coil is equal to or greater than a predetermined threshold, and operate the switching circuits in the second mode when the slew rate is less than the predetermined threshold, to switch the operation mode.

5. The magnetic resonance imaging apparatus according to claim 4, further comprising:
controlling circuitry configured to control imaging, wherein
the controlling circuitry is configured to determine in which of the first mode and the second mode the switching circuits are to be operated, based on the slew rate of the gradient magnetic field, and to transmit a switching signal indicating a result of the determination to the gradient magnetic field power supply, and
the processing circuitry is further configured to switch the operation mode in accordance with the switching signal.

6. The magnetic resonance imaging apparatus according to claim 4, further comprising:
controlling circuitry configured to control imaging, wherein
the controlling circuitry is configured to transmit information indicating the slew rate to the gradient magnetic field power supply, and
the processing circuitry is further configured to determine in which of the first mode and the second mode the switching circuits are to be operated, based on the information indicating the slew rate, and to switch the operation mode in accordance with a result of the determination.

7. The magnetic resonance imaging apparatus according to claim 1, wherein the gradient magnetic field power supply further includes compensating circuitry configured to feed back an output signal that is output from each of the switching circuits,
the processing circuitry is further configured to:
calculate a difference between an input signal indicating a waveform of a gradient magnetic field generated by the gradient coil and a feedback signal transmitted from the compensating circuitry;
convert, with proportionating circuitry, an error signal obtained as the difference with a predetermined proportional gain;
convert, with integrating circuitry, the error signal with a predetermined integral gain; and
add the signal that is output from the proportionating circuitry to the signal that is output from the integrating circuitry, and output a resultant signal as a control signal, and
each of the switching circuits is further configured to output the pulse voltage in accordance with the control signal,
wherein the processing circuitry is further configured to switch the proportional gain and the integral gain when switching the operation mode.

8. The magnetic resonance imaging apparatus according to claim 1, wherein each of the switching circuits is a full bridge circuit.

9. A gradient magnetic field power supply supplying power to a gradient coil in a magnetic resonance imaging apparatus, the gradient magnetic field power supply comprising:
a plurality of switching circuits, each of which includes a plurality of switching elements, and is configured to output a predetermined pulse voltage by performing a switching operation of each of the switching elements; and
processing circuitry configured to switch an operation mode between a first mode and a second mode in accordance with an intensity of voltage to be output to the gradient coil, the first mode causing switching circuits of a first number to perform the switching operation of each of the switching elements among the plurality of switching circuits, and the second mode causing switching circuits of a second number smaller than the first number to perform the switching operation of each of the switching elements among the plurality of switching circuits,
wherein the processing circuitry is further configured to switch the operation mode based on at least one of a duty ratio of the pulse voltage that is output from an operating switching circuit and a slew rate of a gradient magnetic field generated by the gradient coil.

10. A magnetic resonance imaging apparatus, comprising:
a gradient magnetic field power supply configured to supply power to a gradient coil, the gradient magnetic field power supply including
a plurality of switching circuits, each of which includes a plurality of switching elements and is configured to output a predetermined pulse voltage by performing a switching operation of each of the switching elements; and
processing circuitry configured to switch an operation mode between a first mode and a second mode in accordance with an intensity of a voltage to be output to the gradient coil, the first mode causing switching circuits of a first number to perforin the switching operation of each of the switching elements among the switching circuits, and the second mode causing switching circuits of a second number smaller than the first number to perform the switching operation of each of the switching elements among the switching circuits,
wherein the processing circuitry is further configured to switch the operation mode to the second mode when a duty ratio of the pulse voltage that is output from an operating switching circuit becomes less than a first threshold in a state where the switching circuits operate in the first mode, and switch the operation mode to the first mode when the duty ratio of the pulse voltage that is output from the operating switching circuit becomes equal to or greater than a second threshold in a state where the switching circuits operate in the second mode.

11. A magnetic resonance imaging apparatus, comprising:
a gradient magnetic field power supply configured to supply power to a gradient coil, the gradient magnetic field power supply including
a plurality of switching circuits, each of which includes a plurality of switching elements and is configured to output a predetermined pulse voltage by performing a switching operation of each of the switching elements; and
processing circuitry configured to switch an operation mode between a first mode and a second mode in accordance with an intensity of a voltage to be output to the gradient coil, the first mode causing switching circuits of a first number to perform the switching operation of each of the switching elements among the switching circuits, and the second mode causing switching circuits of a second number smaller than the first number to perform the switching operation of each of the switching elements among the switching circuits,
wherein the processing circuitry is further configured to operate the switching circuits in the first mode when a slew rate of a gradient magnetic field generated by the gradient coil is equal to or greater than a predetermined threshold, and operate the switching circuits in the second mode when the slew rate is less than the predetermined threshold, to switch the operation mode.

12. A magnetic resonance imaging apparatus, comprising:
a gradient magnetic field power supply configured to supply power to a gradient coil, the gradient magnetic field power supply including
a plurality of switching circuits, each of which includes a plurality of switching elements and is configured to output a predetermined pulse voltage by performing a switching operation of each of the switching elements; and
processing circuitry configured to change a number of switching circuits that perform the switching operation of each of the switching elements among the switching circuits, in accordance with an intensity of a voltage to be output to the gradient coil,
wherein the processing circuitry is further configured to switch an operation mode between a first mode and a second mode in accordance with the intensity of the voltage to be output to the gradient coil, the first mode causing switching circuits of a first number to perform the switching operation of each of the switching elements among the switching circuits, and the second mode causing switching circuits of a second number smaller than the first number to perform the switching operation of each of the switching elements among the switching circuits, the gradient magnetic field power supply further includes compensating circuitry configured to feed back an output signal that is output from each of the switching circuits, the processing circuitry is further configured to
- calculate a difference between an input signal indicating a waveform of a gradient magnetic field generated by the gradient coil and a feedback signal transmitted from the compensating circuitry;
- convert, with proportionating circuitry, an error signal obtained as the difference with a predetermined proportional gain;
- convert, with integrating circuitry, the error signal with a predetermined integral gain; and
- add the signal that is output from the proportionating circuitry to the signal that is output from the integrating circuitry, and output a resultant signal as a control signal, each of the switching circuits is further configured to output the pulse voltage in accordance with the control signal, and the processing circuitry is further configured to switch the proportional gain and the integral gain when switching the operation mode.

* * * * *